US011735502B2

(12) United States Patent
Lee

(10) Patent No.: US 11,735,502 B2
(45) Date of Patent: Aug. 22, 2023

(54) INTEGRATED CIRCUIT CHIP, PACKAGE SUBSTRATE AND ELECTRONIC ASSEMBLY

(71) Applicant: VIA LABS, INC., New Taipei (TW)

(72) Inventor: Sheng-Yuan Lee, New Taipei (TW)

(73) Assignee: VIA LABS, INC., New Taipei (TW)

( * ) Notice: Subject to any disclaimer, the term of this patent is extended or adjusted under 35 U.S.C. 154(b) by 0 days.

(21) Appl. No.: 16/858,709

(22) Filed: Apr. 27, 2020

(65) Prior Publication Data

US 2021/0098343 A1 Apr. 1, 2021

Related U.S. Application Data

(60) Provisional application No. 62/908,622, filed on Oct. 1, 2019.

(30) Foreign Application Priority Data

Mar. 5, 2020 (TW) .................................. 109107185

(51) Int. Cl.
*H01L 23/485* (2006.01)
*H01L 23/498* (2006.01)
*H01L 23/00* (2006.01)

(52) U.S. Cl.
CPC ...... *H01L 23/485* (2013.01); *H01L 23/49838* (2013.01); *H01L 24/06* (2013.01);
(Continued)

(58) Field of Classification Search
CPC ............................................. H01L 2223/6638
See application file for complete search history.

(56) References Cited

U.S. PATENT DOCUMENTS

| 7,897,880 B1* | 3/2011 | Goergen | ............... H05K 1/0237 |
| | | | 174/265 |
| 10,635,611 B1* | 4/2020 | Srivastava | .......... G06F 13/4081 |

(Continued)

FOREIGN PATENT DOCUMENTS

| CN | 1688954 | 10/2005 |
| TW | 201531178 | 8/2015 |
| TW | M599029 | 7/2020 |

OTHER PUBLICATIONS

"Office Action of Taiwan Counterpart Application", dated Oct. 20, 2021, p. 1-p. 16.

*Primary Examiner* — Nicholas J Tobergte
*Assistant Examiner* — William Henry Anderson
(74) *Attorney, Agent, or Firm* — JCIPRNET

(57) ABSTRACT

An integrated circuit chip has an active surface and a chip pad arrangement on the active surface. The chip pad arrangement includes four pairs of chip pads arranged in two rows along a side edge of the active surface. Two pairs of chip pads are a first transmission differential pair chip pad and a first reception differential pair chip pad respectively. Positions of the two pairs of chip pads are not adjacent to each other and are in different rows. The other two pairs of chip pads are a second transmission differential chip pad and a second reception differential chip pad respectively. Positions of the other two pairs of chip pads are not adjacent to each other and are in different rows. In addition, a package substrate corresponding to the integrated circuit chip and an electronic assembly including the package substrate and the integrated circuit chip are also provided.

28 Claims, 10 Drawing Sheets

(52) U.S. Cl.
CPC ............... *H01L 2224/0615* (2013.01); *H01L 2224/06515* (2013.01)

(56) References Cited

U.S. PATENT DOCUMENTS

| | | | |
|---|---|---|---|
| 11,057,995 B2* | 7/2021 | Cartier, Jr. | ......... H01R 13/6473 |
| 2014/0252612 A1* | 9/2014 | Nakagawa | ........ H01L 23/49822 |
| | | | 257/738 |
| 2014/0300003 A1* | 10/2014 | Kariyazaki | ......... H01L 23/5222 |
| | | | 257/774 |
| 2019/0198462 A1* | 6/2019 | Nakagawa | .......... H01L 23/5383 |
| 2019/0198463 A1* | 6/2019 | Kariyazaki | ....... H01L 23/49827 |
| 2019/0363050 A1* | 11/2019 | Kariyazaki | ........... H05K 1/0246 |
| 2020/0381347 A1* | 12/2020 | Pu | ......................... H01L 23/552 |

* cited by examiner

INTEGRATED CIRCUIT CHIP, PACKAGE SUBSTRATE AND ELECTRONIC ASSEMBLY

CROSS-REFERENCE TO RELATED APPLICATION

This application claims the priority benefits of U.S. provisional application No. 62/908,622, filed on Oct. 1, 2019 and Taiwan application no. 109107185, filed on Mar. 5, 2020. The entirety of each of the above-mentioned patent applications is hereby incorporated by reference herein and made a part of this specification.

TECHNICAL FIELD

The invention relates to a pad arrangement, and more particularly, to an integrated circuit chip and a package substrate having the pad arrangement and an electronic assembly having the integrated circuit chip and the package substrate.

BACKGROUND

The USB interface is widely used in computing and mobile device interconnection. As the computing and mobile devices developed toward smaller, thinner and lighter form-factors, USB Type-C is evolved in interface connectivity systems. In addition, USB Type-C can meet both usability and robustness requirements. It can support the existing USB 2.0, USB 3.1 and USB Power Delivery specifications and has multichannel and flip-able features. The so-called "flip-able" here means that users do not need to consider the directionality when plugging or unplugging the USB Type-C interface, which is more convenient. Because of the flip-able feature, there are two pairs of TX and RX signals in the Type C Serdes (serializer/deserializer) such as two pairs of TX and RX signals provided in USB 3.1 Gen 1 (5 Gbps) and Gen 2 (10 Gbps) specifications, but only one pair of TX and RX is connected to transfer signals. However, it is necessary to include a pin arrangement with two pairs of TX and RX in the related host-side/down-port IC (integrated circuit) design since the mated device may have only one pair of TX and RX and must be connected to the host IC (host integrated circuit) through either pair of host-side TX and RX for the signal transmission.

SUMMARY

The invention provides an integrated circuit chip for reducing crosstalk generated when transmitting signals between differential pairs.

The invention provides a package substrate for reducing crosstalk generated when transmitting signals between differential pairs.

The invention provides an electronic assembly for reducing crosstalk generated when transmitting signals between differential pairs.

An integrated circuit chip of an embodiment of the invention has an active surface and a first chip pad arrangement located on the active surface. The first chip pad arrangement includes a first pair of chip pads, a second pair of chip pads, a third pair of chip pads and a fourth pair of chip pads. The first pair of chip pads and the second pair of chip pads are sequentially arranged in a first row along a side edge of the active surface. The third pair of chip pads and the fourth pair of chip pads are sequentially arranged in a second row along the side edge of the active surface. The first pair of chip pads is located between the side edge of the active surface and the third pair of chip pads. The second pair of chip pads is located between the side edge of the active surface and the fourth pair of chip pads. The first pair of chip pads is one of a first transmission differential pair chip pad and a first reception differential pair chip pad, and the fourth pair of chip pads is the other one of the first transmission differential pair chip pad and the first reception differential pair chip pad. The second pair of chip pads is one of a second transmission differential pair chip pad and a second reception differential pair chip pad, and the third pair of chip pads is the other one of the second transmission differential pair chip pad and the second reception differential pair chip pad.

A package substrate of an embodiment of the invention is adapted for installing an integrated circuit chip in a flip-chip bonding manner and has a chip area and a first substrate pad arrangement located on the chip area. The first substrate pad arrangement includes a first pair of substrate pads, a second pair of substrate pads, a third pair of substrate pads and a fourth pair of substrate pads. The first pair of substrate pads and the second pair of substrate pads are sequentially arranged in a first row along a side edge of the chip area. The third pair of substrate pads and the fourth pair of substrate pads are sequentially arranged in a second row along the side edge of the chip area. The first pair of substrate pads is located between the side edge of the chip area and the third pair of substrate pads. The second pair of substrate pads is located between the side edge of the chip area and the fourth pair of substrate pads. The first pair of substrate pads is one of a first transmission differential pair substrate pad and a first reception differential pair substrate pad, and the fourth pair of substrate pads is the other one of the first transmission differential pair substrate pad and the first reception differential pair substrate pad. The second pair of substrate pads is one of a second transmission differential pair substrate pad and a second reception differential pair substrate pad, and the third pair of substrate pads is the other one of the second transmission differential pair substrate pad and the second reception differential pair substrate pad.

An electronic assembly of an embodiment of the invention includes a package substrate and an integrated circuit chip. The package substrate has a chip area and a first substrate pad arrangement located on the chip area. The first substrate pad arrangement includes a first pair of substrate pads, a second pair of substrate pads, a third pair of substrate pads and a fourth pair of substrate pads. The first pair of substrate pads and the second pair of substrate pads are sequentially arranged in a first row along a side edge of the chip area. The third pair of substrate pads and the fourth pair of substrate pads are sequentially arranged in a second row along the side edge of the chip area. The first pair of substrate pads is located between the side edge of the chip area and the third pair of substrate pads. The second pair of substrate pads is located between the side edge of the chip area and the fourth pair of substrate pads. The first pair of substrate pads is one of a first transmission differential pair substrate pad and a first reception differential pair substrate pad, and the fourth pair of substrate pads is the other one of the first transmission differential pair substrate pad and the first reception differential pair substrate pad. The second pair of substrate pads is one of a second transmission differential pair substrate pad and a second reception differential pair substrate pad, and the third pair of substrate pads is the other one of the second transmission differential pair substrate pad and the second reception differential pair substrate pad. The integrated circuit chip is installed on the chip area of the package substrate in a flip-chip bonding manner.

Based on the above, in the embodiments of the invention, for the integrated circuit chip, by arranging two groups of transmission and reception (TX and RX) differential pair chip pads in two rows, and placing the transmission and reception differential pair chip pads of the same group on positions not adjacent to each other and in different rows, crosstalk between the transmission and reception differential pair chip pads of the same group may be reduced. For the package substrate, by arranging two groups of transmission and reception (TX and RX) differential pair substrate pads in two rows, and placing the transmission and reception differential pair substrate pads of the same group on positions not adjacent to each other and in different rows, crosstalk between the transmission and reception differential pair substrate pads of the same group may be reduced.

DETAILED DESCRIPTION

A FC (Flip-chip) package is a kind of IC (Intergraded Circuit) packages, which uses bumps (solder or copper pillar bumps) instead of bond wires to realize connections between an IC chip and a package substrate. The FC package can eliminate high parasitic inductance caused by the thin bond wires and significantly enhance the performance of the packages, especially for the Serdes signals beyond 10 Gbps. The FC package can benefit the design of USB 3.1 Gen. 2 (10-Gbps data rate) or even the design of upcoming USB 4 (20-Gbps data rate). The arrangement of FC bumps can be in the form of an in-lined or staggered array, depending on actual requirements.

Based on the flip-able requirement, the USB TYPE-C port requires at least eight transmission/reception differential signals, including: first transmission differential pair signals TX1+/−, first reception differential pair signals RX1+/−, second transmission differential pair signals TX2+/− and second reception differential pair signals RX2+/−. Further, the differential signals described above are in a full-duplex transmission mode, i.e., the signals may be transmitted or received at the same time. In a chip design, pads corresponding to the transmission/reception differential pair signals are usually arranged in the same outer row on a pad array. Hence, it is not necessary to change a fan-out of these signals on the package (i.e., routed outwardly from inside a chip area 202) to be routed on other metal layers of a package substrate 200. However, an IC element of the Type-C USB (e.g., a USB hub) often has plurality of Type-C ports. Therefore, if all the pads connected to TX/RX differential pair signals are arranged in the same outside row, a chip size will be too big and the costs will be significantly increased.

Because the USB Type-C supports the flip-able feature, each time when electrically connected, only the first transmission/reception differential pair signals TX1/RX1 or only the second transmission/reception differential pair signals TX2/RX2 are transmitted. In other words, when the first transmission/reception differential pair signals TX1+/−/RX1+/− are transmitted, the second transmission/reception differential pair signals TX2+/−/RX2+/− are not transmitted or maintain the original state, and visa versa. Accordingly, with all the above considerations, the invention proposes to use multiple rows of pad arrays for the TX/RX differential pair signals TX/RX in the USB Type-C port. Furthermore, the pads electrically connected to the TX/RX differential signals are disposed on positions not adjacent to each other and in different rows to prevent being close to each other and affecting signal quality. Detailed description thereof is provided below.

Figure 1:
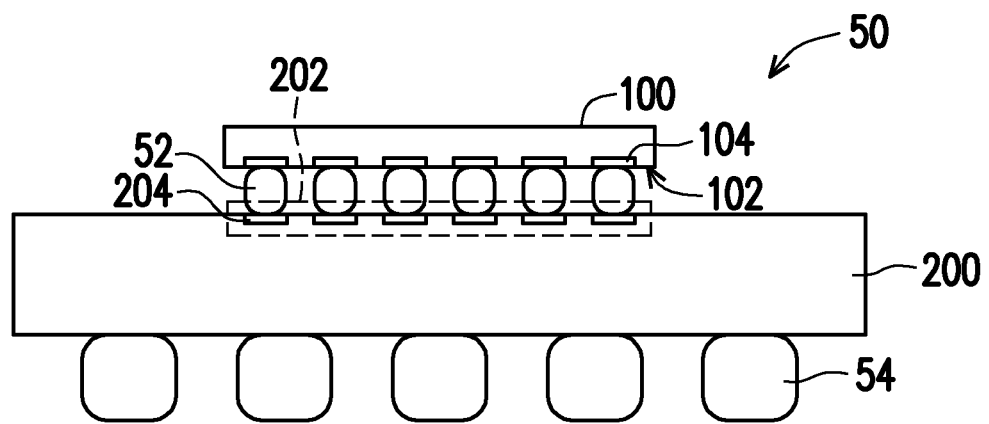
FIG. 1 is a side view of an electronic assembly of an embodiment of the invention.

FIG. 1 shows an electronic assembly 50 of an embodiment of the invention. In this embodiment, the electronic assembly 50 includes an integrated circuit chip 100 and the package substrate 200, and the integrated circuit chip 100 is located on the package substrate 200 in a flip-chip bonding manner. Specifically, the integrated circuit chip 100 has an active surface 102 and a plurality of chip pads 104 located on the active surface 102, and the package substrate 200 has the chip area 202 and a plurality of substrate pads 204 located on the chip area 202. The integrated circuit chip 100 is disposed on the chip area 202 of the package substrate 200 in the flip-chip bonding manner (e.g., through a plurality of conductive bumps 52), so that the chip pads 104 of the integrated circuit chip 100 are electrically connected to the substrate pads 204 of the package substrate 200, respectively. In addition, the electronic assembly 50 may further include a plurality of conductive media (e.g., a plurality of solder balls 54) for installing the next-level components, such as a motherboard and the like.

FIG. 2A to FIG. 2D show a chip pad arrangement for differential pair signals of the USB Type-C port. FIG. 2A to FIG. 2D are viewed from the back of the integrated circuit wafer 100, (i.e., a top view from top to bottom), and thus the chip pads 104 are shown by dashed lines. The chip pads 104 are disposed on the active surface 102 of the integrated circuit chip 100.

Figure 2A:
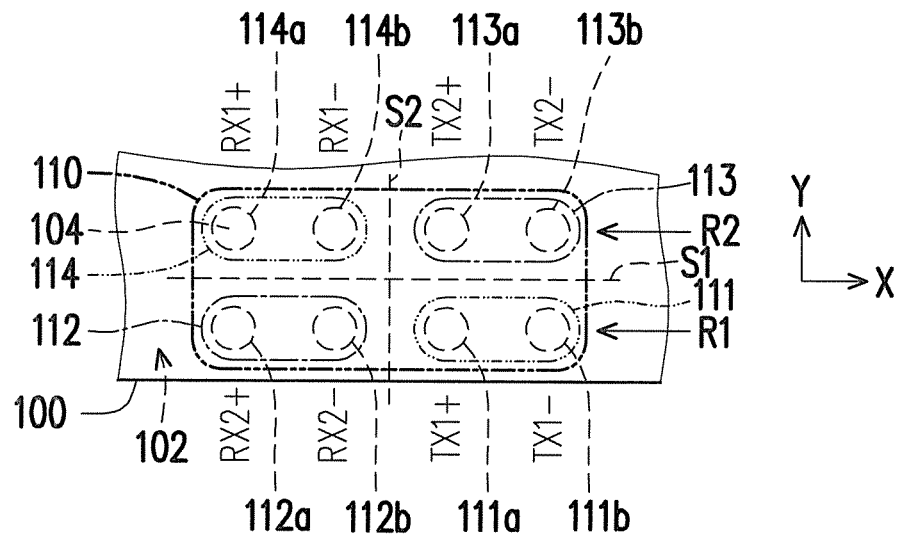
FIG. 2A is a partial top view of the integrated circuit chip structure of FIG. 1.

Referring to FIG. 1 and FIG. 2A, the integrated circuit chip 100 includes a first chip pad arrangement 110 composed of some of the chip pads 104 (e.g., 8 chip pads 104 partially supporting USB Type-C port in this embodiment). The first chip pad arrangement 110 includes a first pair of chip pads 111, a second pair of chip pads 112, a third pair of chip pads 113 and a fourth pair of chip pads 114. The first pair of chip pads 111 and the second pair of chip pads 112 are sequentially arranged in a first row R1 along a side edge of the active surface 102. The third pair of chip pads 113 and the fourth pair of chip pads 114 are sequentially arranged in a second row R2 along the side edge of the active surface 102. The first pair of chip pads 111 is located between the side edge of the active surface 102 and the third pair of chip pads 113. The second pair of chip pads 112 is located between the side edge of the active surface 102 and the fourth pair of chip pads 114. In addition, compared with the second row R2 described above, the first row R1 is farther from a middle area of the integrated circuit chip 100, i.e., closer to an outer side of the integrated circuit chip 100. Further, in this embodiment, a positional relationship of the four pairs of chip pads is represented by "rows", but is not intended to limit the invention. In other embodiments, "columns" may also be used to represent the positional relationship of the four pairs of chip pads.

In addition, the first pair of chip pads 111 includes one first transmission differential pair chip pad 111a (TX1+) and the other first transmission differential pair chip pad 111b (TX1−). The second pair of chip pads 112 includes one second reception differential pair chip pad 112a (RX2+) and the other second reception differential pair chip pad 112b (RX2−). Accordingly, from left to right in the figure, the first row R1 includes the differential pair chip pads 112a (RX2+), 112b (RX2−), 111a (TX1+) and 111b (TX1−) in that sequence. The fourth pair of chip pads 114 includes one first reception differential pair chip pad 114a (RX1+) and the other first reception differential pair chip pad 114b (RX1−). The third pair of chip pads 113 includes one second transmission differential pair chip pad 113a (TX2+) and the other second transmission differential pair chip pad 113b (TX2−). Accordingly, from left to right in the figure, the second row R2 includes the differential pair chip pads 114a (RX1+), 114b (RX1−), 113a (TX2+) and 113b (TX2−) in that sequence. It should be noted that the sequence from left to right of the differential pair chip pads is only a description manner, but the invention is not limited to this description manner. In addition, positions of the chip pads 104 of the same pair of differential chip pads 111 to 114 can be interchanged with each other. For example, in FIG. 2A, the first transmission differential pair chip pad 111a (TX1+) and the first transmission differential pair chip pad 111b (TX1−) are interchangeable, and this is only a description manner in this embodiment rather than limitations to the invention.

Because the USB TYPE-C port has the flip-able features, each port needs to be configured with at least two groups of transmission/reception differential pair signals. However, when being electrically connected, only one group of transmission/reception differential pair signals is transmitted. According to the embodiment above, the first transmission differential pair chip pads 111a and 111b (TX1+, TX1−) and the first reception differential pair chip pads 114a and 114b (RX1+, RX1−) are not adjacent to each other and not in the same row, but disposed at approximately diagonal positions to avoid unnecessary coupling. Similarly, the second transmission differential pair chip pads 113a and 113b (TX2+, TX2−) and the second reception differential pair chip pads 112a and 112b (RX2+, RX2−) are not adjacent to each other and not in the same row, but disposed at approximately diagonal positions to avoid unnecessary coupling. Furthermore, from the perspective of mutually perpendicular XY coordinates, projections of the first pair of chip pads 111 and the fourth pair of chip pads 114 on the X axis or the Y axis do not overlap with each other. That is, the projections of the first pair of chip pads 111 and the fourth pair of chip pads 114 on a straight line S1 parallel to the first row R1 or on a straight line S2 perpendicular to the first row R1 do not overlap with each other. Projections of the third pair of chip pads 113 and the second pair of chip pads 112 on the X axis or the Y axis do not overlap with each other. That is, the projections of the third pair of chip pads 113 and the second pair of chip pads 112 on the straight line S1 parallel to the first row R1 or on the straight line S2 perpendicular to the first row R1 do not overlap with each other. The projections of the first pair of chip pads 111 and the third pair of chip pads 113 on the X axis partially overlap or completely overlap with each other. The projections of the fourth pair of chip pads 114 and the second pair of chip pads 112 on the X axis partially overlap or completely overlap with each other. That is, the projections of the first pair of chip pads 111 and the third pair of chip pads 113 on the straight line S1 parallel to the first row R1 partially overlap or completely overlap with each other, and the projections of the fourth pair of chip pads 114 and the second pair of chip pads 112 on the straight line S1 partially overlap or completely overlap with each other. The projections of the first pair of chip pads 111 and the second pair of chip pads 112 on the Y axis partially overlap or completely overlap with each other. The projections of the third pair of chip pads 113 and the fourth pair of chip pads 114 on the Y axis partially overlap or completely overlap with each other. That is, the projections of the first pair of chip pads 111 and the second pair of chip pads 112 on the straight line S2 perpendicular to the first row R1 partially overlap or completely overlap with each other, and the projections of the third pair of chip pads 113 and the fourth pair of chip pads 114 on the straight line S2 partially overlap or completely overlap with each other. In addition, the differential pair chip pads 111 to 114 are compatible with specifications of USB 4 or below.

Figure 2B:
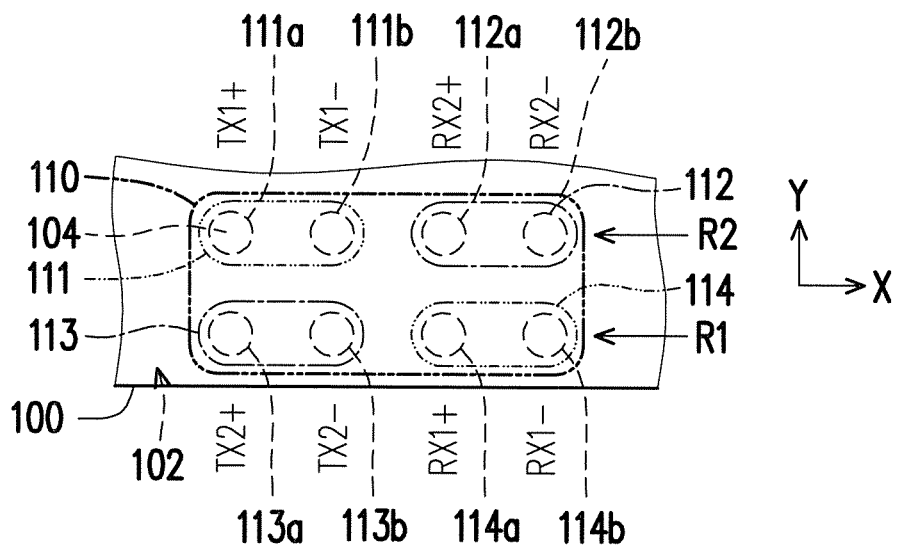
FIG. 2B is a partial top view of an integrated circuit chip of another embodiment of the invention.

Referring to FIG. 2B, compared with the embodiment of FIG. 2A, in this embodiment, the original positions of the first pair of chip pads 111 and the fourth pair of chip pads 114 of FIG. 2A are interchanged, and the original positions of the second pair of chip pads 112 and the third pair of chip pads 113 of FIG. 2A are interchanged. In other words, the third pair of chip pads 113 (the second transmission differential pair chip pads 113a (TX2+) and 113b (TX2−)) and the fourth pair of chip pads 114 (the first reception differential pair chip pads 114a (RX1+) and 114b (RX1−)) are sequentially arranged in the first row R1 along the side edge of the active surface 102. The second pair of chip pads 112 (the second reception differential pair chip pads 112a (RX2+) and 112b (RX2−)) and the first pair of chip pads 111 (the first transmission differential pair chip pads 111a (TX1+) and 111b (TX1−)) are sequentially arranged in the second row R2 along the side edge of the active surface 102. Compared with the second row R2 described above, the first row R1 is farther from a middle area of the integrated circuit chip 100, i.e., closer to an outer side of the integrated circuit chip 100. Similar to FIG. 2A, the transmission differential pair chip pads and the reception differential pair chip pads of the same group are disposed not adjacent to each other and not in the same row, but at approximately diagonal positions. Because the projections of the transmission/reception differential pair chip pads of the same group on the X axis or the Y axis do not overlap with each other and the projections of the transmission/reception differential pair chip pads of different groups on the X axis or the Y axis partially overlap or completely overlap with each other, unnecessary coupling may also be avoided.

Figure 2C:
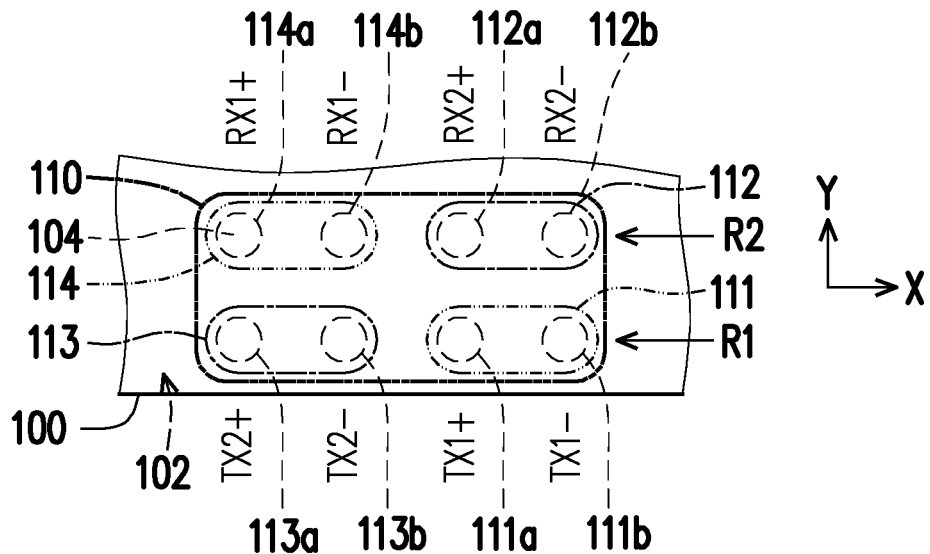
FIG. 2C is a partial top view of an integrated circuit chip of another embodiment of the invention.

Referring to FIG. 2C, compared with the embodiment of FIG. 2A, in this embodiment, only the original positions of the second pair of chip pads 112 and the third pair of chip pads 113 of FIG. 2A are interchanged. In other words, the third pair of chip pads 113 (the second transmission differential pair chip pads 113a (TX2+) and 113b (TX2−)) and the first pair of chip pads 111 (the first transmission differential pair chip pads 111a (TX1+) and 111b (TX1−)) are sequentially arranged in the first row R1 along the side edge of the active surface 102. The fourth pair of chip pads 114 (the first reception differential pair chip pads 114a (RX1+) and 114b (RX1−)) and the second pair of chip pads 112 (the second reception differential pair chip pads 112a (RX2+) and 111b (RX2−)) are sequentially arranged in the second row R2 along the side edge of the active surface 102. Compared with the second row R2 described above, the first row R1 is farther from a middle area of the integrated circuit chip 100, i.e., closer to an outer side of the integrated circuit chip 100. Similar to FIG. 2A, the transmission differential pair chip pads and reception differential pair chip pads of the same group are disposed not in the same row and not adjacent to each other, but at approximately diagonal positions. Because the projections of the transmission/reception differential pair chip pads of the same group on the X axis or the Y axis do not overlap with each other and the projections of the transmission/reception differential pair chip pads of different groups on the X axis or the Y axis partially overlap or completely overlap with each other, unnecessary coupling may also be avoided.

Figure 2D:
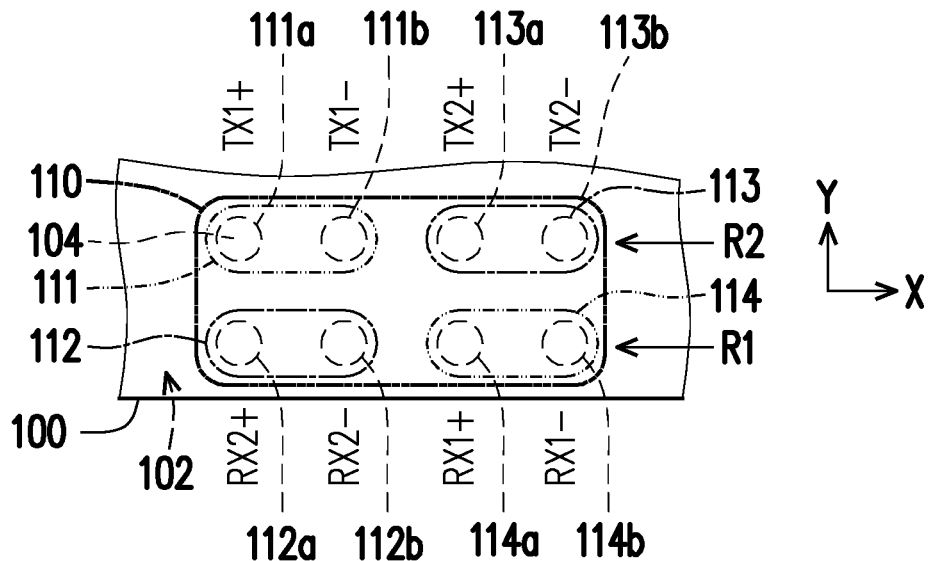
FIG. 2D is a partial top view of an integrated circuit chip of another embodiment of the invention.

Referring to FIG. 2D, compared with the embodiment of FIG. 2A, in this embodiment, only the original positions of the first pair of chip pads 111 and the fourth pair of chip pads 114 of FIG. 2A are interchanged. In other words, the second pair of chip pads 112 (the second reception differential pair chip pads 112a (RX2+) and 112b (RX2−)) and the fourth pair of chip pads 114 (the first reception differential pair chip pads 114a (RX1+) and 114b (RX1−)) are sequentially arranged in the first row R1 along the side edge of the active surface 102. The first pair of chip pads 111 (the first transmission differential pair chip pads 111a (TX1+) and 111b (TX1−)) and the third pair of chip pads 113 (the second transmission differential pair chip pads 113a (TX2+) and 113b (TX2−)) are sequentially arranged in the second row R2 along the side edge of the active surface 102. Compared with the second row R2 described above, the first row R1 is farther from a middle area of the integrated circuit chip 100, i.e., closer to an outer side of the integrated circuit chip 100. Similar to FIG. 2A, the transmission differential pair chip pads and reception differential pair chip pads of the same group are disposed not in the same row and not adjacent to each other, but at approximately diagonal positions. Because the projections of the transmission/reception differential pair chip pads of the same group on the X axis or the Y axis do not overlap with each other and the projections of the transmission/reception differential pair chip pads of different groups on the X axis or the Y axis partially overlap or completely overlap with each other, unnecessary coupling may also be avoided.

Figure 3A:
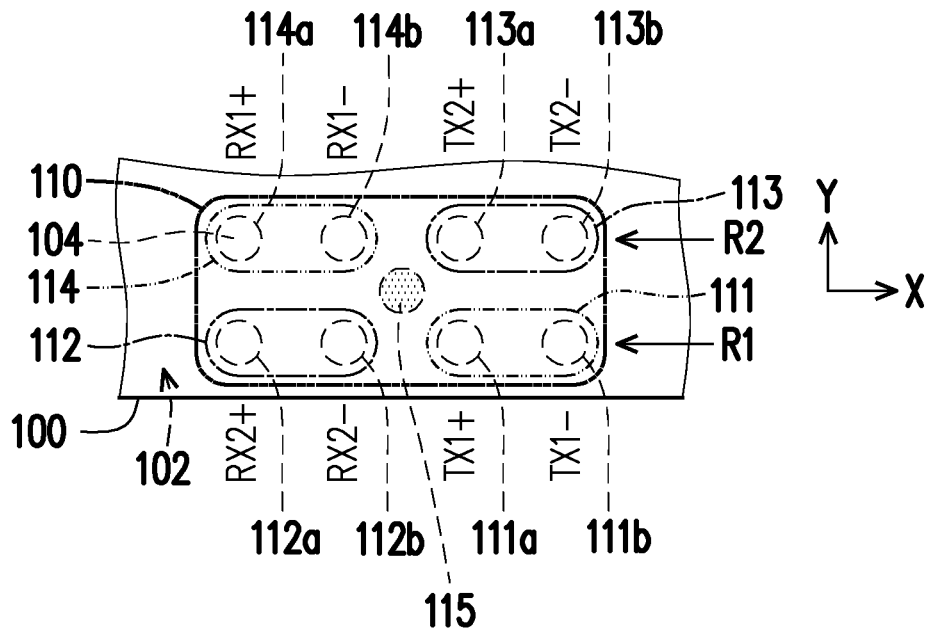
FIG. 3A is a partial top view of an integrated circuit chip of another embodiment of the invention.
Figure 3B:
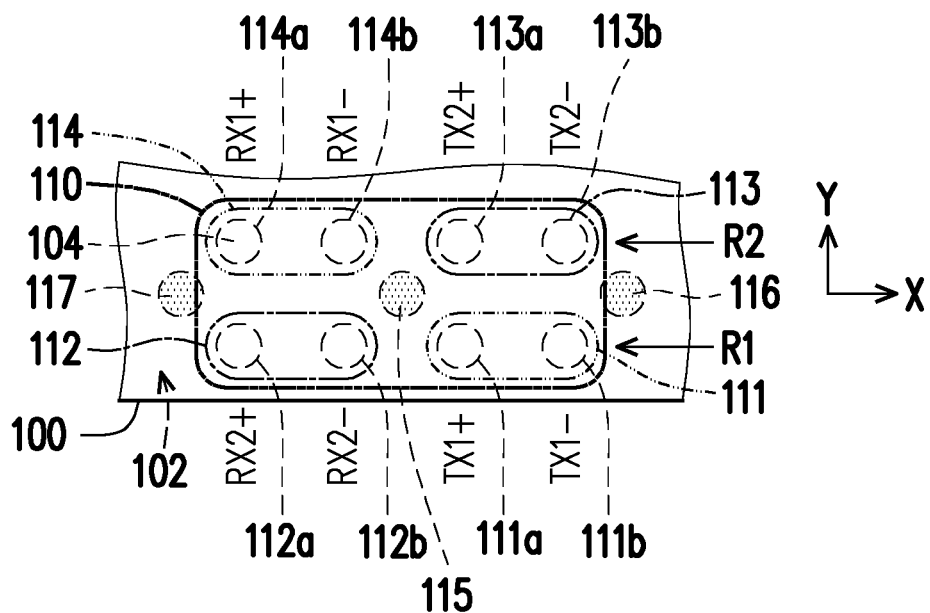
FIG. 3B is a partial top view of an integrated circuit chip of another embodiment of the invention.
Figure 3C:
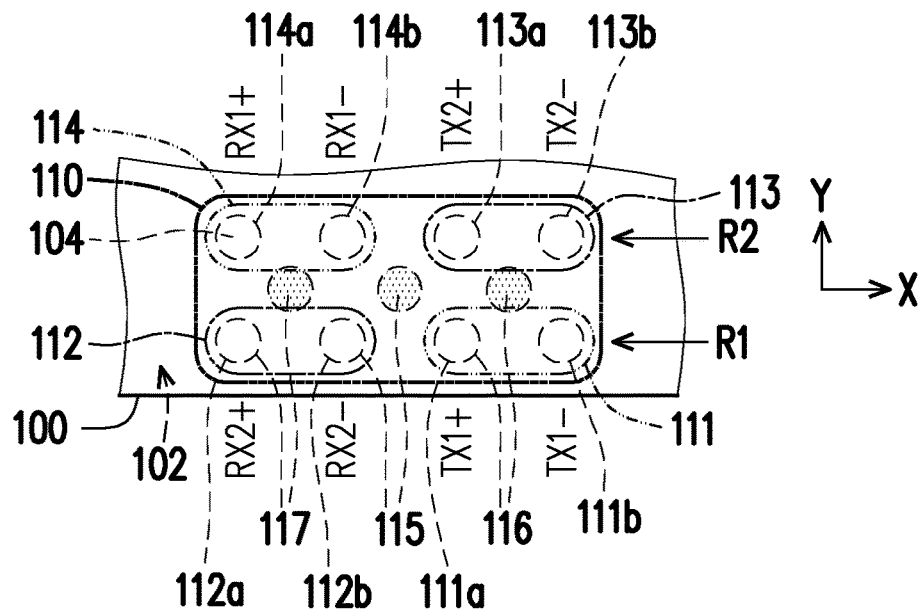
FIG. 3C is a partial top view of an integrated circuit chip of another embodiment of the invention.

FIG. 3A to FIG. 3C illustrate embodiments based on the chip pad arrangement of FIG. 2A with an additional ground (GND/VSS) chip pad to achieve more isolations between the transmission differential pair chip pads and the reception differential pair chip pads of the same group. Similarly, FIG. 3A to FIG. 3C are viewed from the back of the integrated circuit wafer 100 (i.e., a top view from top down), and thus the chip pads 104 are shown by dashed lines and the chip pads 104 are arranged on the active surface of the integrated circuit chip 100.

In FIG. 3A, a ground chip pad is inserted in the middle of the chip pad arrangement. In other words, the first chip pad arrangement 110 includes a first ground chip pad 115, which is located between the first pair of chip pads 111, the second pair of chip pads 112, the third pair of chip pads 113 and the fourth pair of chip pads 114. In detail, when electrically connected, the ground chip pad 115 isolates the first transmission differential pair chip pads 111a and 111b (TX1+ and TX1−) and the first reception differential pair chip pads 114a and 114b (RX1+ and RX1−). In other words, the ground chip pad 115 is disposed between the first transmission differential pair chip pad 111a and the first reception differential pair chip pad 114b. Here, for the transmission/reception differential pair chip pads of the same group (the first pair of chip pads 111 and the fourth pair of chip pads 114), the shortest distance is between the first transmission differential pair chip pad 111a and the first reception differential pair chip pad 114b. Similarly, in another embodiment, when electrically connected, the ground chip pad 115 isolates the second transmission differential pair chip pads 113a and 113b (TX2+ and TX2−) and the second reception differential pair chip pads 112a and 112b (RX2+ and RX2−). In other words, the ground chip pad 115 is disposed between the second transmission differential pair chip pad 113a and the second reception differential pair chip pad 112b. Here, for the transmission/reception differential pair chip pads of the same group (the third pair of chip pads 113 and the second pair of chip pads 112), the shortest distance is between the second transmission differential pair chip pad 113a and the second reception differential pair chip pad 112b. Compared with FIG. 2A, the configuration of the ground chip pad 115 may further avoid the problem of signal coupling between the transmission/reception differential pair chip pads of the same group.

Compared with FIG. 3A, a second ground chip pad 116 and a third ground chip pad 117 are additionally included in FIG. 3B, i.e., there are three ground chip pads in this embodiment. In this embodiment, the second ground chip pad 116 and the third ground chip pad 117 additionally included are disposed on the right and left sides of the first chip pad arrangement 110, respectively. In other words, in an X direction from left to right, the pads are the third ground chip pad 117, the second/fourth pair of chip pads 112/114, the first ground chip pad 115, the first/third pair of chip pads 111/113 and the second ground chip pad 116 in that sequence. In a Y direction from bottom to top, the pads are the first/second pair of chip pads 111/112, the first/second/third ground chip pads 115/116/117 and the third/fourth pair of chip pads 113/114 in that sequence. In other words, the second ground chip pad 116 is located on one side of the first pair of chip pads 111 and the third pair of chip pads 113 farther from the first ground chip pad 115. The third ground chip pad 117 is located on one side of the second pair of chip pads 112 and the fourth pair of chip pads 114 farther from the first ground chip pad 115. Such configuration of the chip pads may also further avoid the problem of signal coupling between the transmission/reception differential pair chip pads of the same group.

Compared with FIG. 3A, a second ground chip pad 116 and a third ground chip pad 117 are additionally included in FIG. 3C, i.e., there are three ground chip pads. In this embodiment, the second ground chip pad 116 and the third ground chip pad 117 additionally included are disposed between the first pair of chip pads 111 and the third pair of chip pads 113 and between the second pair of chip pads 112 and the fourth pair of chip pads 114, respectively. In other words, in an X direction from left to right, the pads are the second reception differential pair chip pad 112a (RX2+)/the first reception differential pair chip pad 114a (RX1+), the third ground chip pad 117, the second reception differential pair chip pad 112b (RX2−)/the first reception differential pair chip pad 114b (RX1−), the first ground chip pad 115, the first transmission differential pair chip pad 111a (TX1+)/the second transmission differential pair chip pad 113a (TX2+), the second ground chip pad 116 and the first transmission differential pair chip pad 111b (TX1−)/the second transmission differential pair chip pad 113b (TX2−) in that sequence. In a Y direction from bottom to top, the pads are the first/second pair of chip pads 111/112, the first/second/third ground chip pads 115/116/117 and the third/fourth pair of chip pads 113/114 in that sequence. In other words, the second ground chip pad 116 is located between the first pair of chip pads 111 and the third pair of chip pads 113. The third ground chip pad 117 is located between the second pair of chip pads 112 and the fourth pair of chip pads 114. Such configuration of the chip pads may also further avoid the problem of signal coupling between the transmission/reception differential pair chip pads of the same group.

Figure 4:
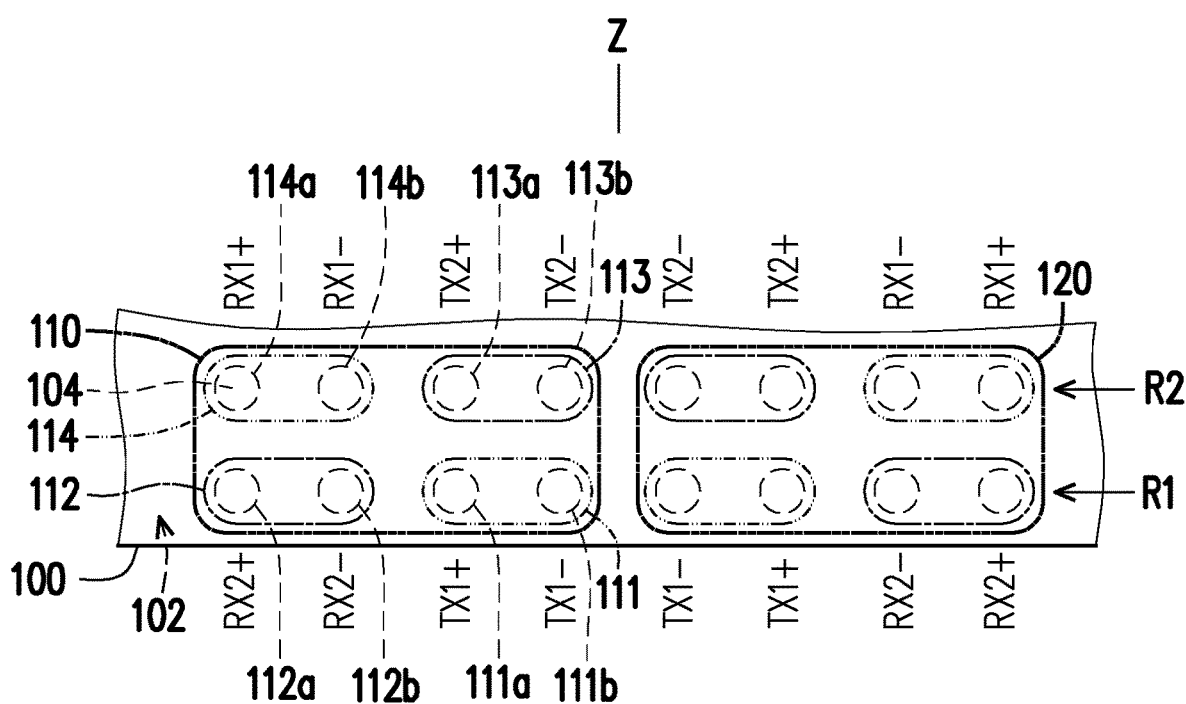
FIG. 4 is a partial top view of an integrated circuit chip of another embodiment of the invention.

FIG. 4 shows another embodiment by a top view from top to bottom as viewed from the back of the chip. The integrated circuit chip 100 further includes a second chip pad arrangement 120. The second chip pad arrangement 120 is located on the active surface 102 and arranged side by side with the first chip pad arrangement 110 along the side edge of the active surface 102. A layout of the chip pads 104 of the second chip pad arrangement 120 and a layout of the chip pads 104 of the first chip pad arrangement 110 are symmetrical to each other. In other words, based on a symmetry line Z, the first chip pad arrangement 110 and the second chip pad arrangement 120 are in a mirror relationship. In this embodiment, two Type-C ports are taken as an example, but not intended to limit the application of the invention. In addition, the first chip pad arrangement 110 and the second chip pad arrangement 120 respectively support one single Type-C port and are compatible with specifications of USB 4 or below. It means the first chip pad arrangement 110 and the second chip pad arrangement 120 support different Type-C port.

In the foregoing embodiments, the first transmission differential pair chip pads 111a and 111b (TX1+ and TX1−), the first reception differential pair chip pads 114a and 114b (RX1+ and RX1−), the second transmission differential pair chip pads 113a and 113b (TX2+ and TX2−) and the second reception differential pair chip pads 112a and 112b (RX2+ and RX2−) may be used as down ports of the UBS hub.

FIG. 5A to FIG. 5D show a substrate pad arrangement for differential pair signals of the USB Type-C port.

Figure 5A:
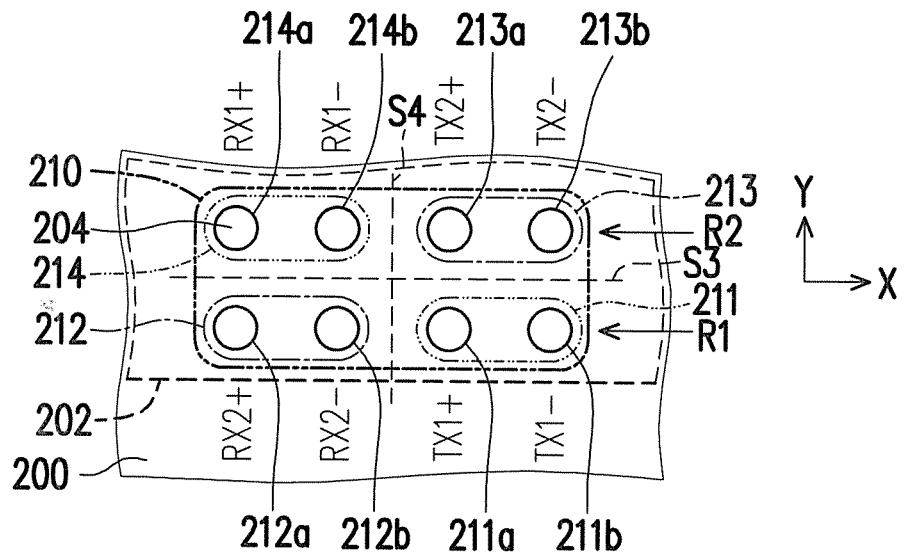
FIG. 5A is a partial top view of the package substrate of FIG. 1.

Referring to FIG. 1 and FIG. 5A, the package substrate 200 includes a first substrate pad arrangement 210 composed of some of the substrate pads 204 (e.g., 8 substrate pads 204 partially supporting USB Type-C port in this embodiment). The first substrate pad arrangement 210 includes a first pair of substrate pads 211, a second pair of substrate pads 212, a third pair of substrate pads 213 and a fourth pair of substrate pads 214. The first pair of substrate pads 211 and the second pair of substrate pads 212 are sequentially arranged in a first row R1 along a side edge of the chip area 202. The third pair of substrate pads 213 and the fourth pair of substrate pads 214 are sequentially arranged in a second row R2 along the side edge of the chip area 202. The first pair of substrate pads 211 is located between the side edge of the chip area 202 and the third pair of substrate pads 213. The second pair of substrate pads 212 is located between the side edge of the chip area 202 and the fourth pair of substrate pads 214. In addition, compared with the second row R2 described above, the first row R1 is farther from a middle area of the package substrate 200, i.e., closer to an outer side of the package substrate 200. Further, in this embodiment, a positional relationship of the four pairs of substrate pads is represented by "rows", but is not intended to limit the invention. In other embodiments, "columns" may also be used to represent the positional relationship of the four pairs of substrate pads. Furthermore, if the electronic assembly 50 in FIG. 1 is viewed from top to bottom (as a top view), the first pair of chip pads 111 shown in FIG. 2A is electrically connected to the first pair of substrate pads 211, the second pair of chip pads 112 shown in FIG. 2A is electrically connected to the second pair of substrate pads 212, the third pair of chip pads 113 shown in FIG. 2A is electrically connected to the third pair of substrate pads 213, and the fourth pair of chip pads 114 shown in FIG. 2A is electrically connected to the fourth pair of substrate pads 214. The electrical connections above may be completed through the conductive bumps 52 of FIG. 1.

In addition, the first pair of substrate pads 211 includes one first transmission differential pair substrate pad 211a (TX1+) and the other first transmission differential pair substrate pad 211b (TX1−). The second pair of substrate pads 212 includes one second reception differential pair substrate pad 212a (RX2+) and the other second reception differential pair substrate pad 212b (RX2−). Accordingly, from left to right in the figure, the first row R1 includes the differential pair substrate pads 212a (RX2+), 212b (RX2−), 211a (TX1+) and 211b (TX1−) in that sequence. The fourth pair of substrate pads 214 includes one first reception differential pair substrate pad 214a (RX1+) and the other first reception differential pair substrate pad 214b (RX1−). The third pair of substrate pads 213 includes one second transmission differential pair substrate pad 213a (TX2+) and the other second transmission differential pair substrate pad 213b (TX2−). Accordingly, from left to right in the figure, the second row R2 includes the differential pair substrate pads 214a (RX1+), 214b (RX1−), 213a (TX2+) and 213b (TX2−) in that sequence. It should be noted that the sequence from left to right of the differential pair substrate pads is only a description manner, but the invention is not limited to this description manner. In addition, positions of the substrate pads 214 of the same pair of differential substrate pads 211 to 214 can be interchanged with each other. For example, in FIG. 5A, the first transmission differential pair substrate pad 211a (TX1+) and the first transmission differential pair substrate pad 211b (TX1−) are interchangeable, and this is only a description manner in this embodiment rather than limitations to the invention.

Because the USB TYPE-C port has the flip-able features, each port needs to be configured with at least two groups of transmission/reception differential pair signals. However, when being electrically connected, only one group of transmission/reception differential pair signals is transmitted. According to the embodiment above, the first transmission differential pair substrate pads 211a and 211b (TX1+, TX1−) and the first reception differential pair substrate pads 214a and 214b (RX1+, RX1−) are not adjacent to each other and not in the same row, but at approximately diagonal positions to avoid unnecessary coupling. Similarly, the second transmission differential pair substrate pads 213a and 213b (TX2+, TX2−) and the second reception differential pair substrate pads 212a and 212b (RX2+, RX2−) are not adjacent to each other and not in the same row, but at approximately diagonal positions to avoid unnecessary coupling. Furthermore, from the perspective of mutually perpendicular XY coordinates, projections of the first pair of substrate pads 211 and the fourth pair of substrate pads 214 on the X axis or the Y axis do not overlap with each other. That is, the projections of the first pair of substrate pads 211 and the fourth pair of substrate pads 214 on a straight line S3 parallel to the first row R1 or on a straight line S4 perpendicular to the first row R1 do not overlap with each other. Projections of the third pair of substrate pads 213 and the second pair of substrate pads 212 on the X axis or the Y axis do not overlap with each other. That is, the projections of the third pair of substrate pads 213 and the second pair of substrate pads 212 on the straight line S3 parallel to the first row R1 or on the straight line S4 perpendicular to the first row R1 do not overlap with each other. The projections of the first pair of substrate pads 211 and the third pair of substrate pads 213 on the X axis partially overlap or completely overlap with each other. The projections of the fourth pair of substrate pads 214 and the second pair of substrate pads 212 on the X axis partially overlap or completely overlap with each other. That is, the projections of the first pair of substrate pads 211 and the third pair of substrate pads 213 on the straight line S3 parallel to the first row R1 partially overlap or completely overlap with each other, and the projections of the fourth pair of substrate pads 214 and the second pair of substrate pads 212 on the straight line S3 partially overlap or completely overlap with each other. The projections of the first pair of substrate pads 211 and the second pair of substrate pads 212 on the Y axis partially overlap or completely overlap with each other. The projections of the third pair of substrate pads 213 and the fourth pair of substrate pads 214 on the Y axis partially overlap or completely overlap with each other. That is, the projections of the first pair of substrate pads 211 and the second pair of substrate pads 212 on the straight line S4 perpendicular to the first row R1 partially overlap or completely overlap with each other, and the projections of the third pair of substrate pads 213 and the fourth pair of substrate pads 214 on the straight line S4 partially overlap or completely overlap with each other. In addition, the differential pair substrate pads 211 to 214 are compatible with specifications of USB 4 or below.

Figure 5B:
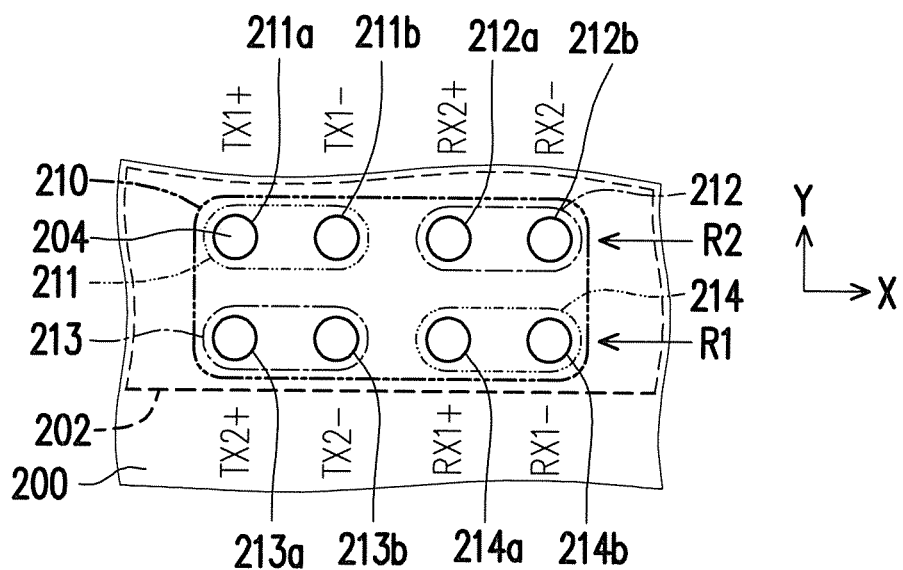
FIG. 5B is a partial top view of a package substrate of another embodiment of the invention.

Referring to FIG. 5B, compared with the embodiment of FIG. 5A, in this embodiment, the original positions of the first pair of substrate pads 211 and the fourth pair of substrate pads 214 of FIG. 5A are interchanged, and the original positions of the second pair of substrate pads 212 and the third pair of substrate pads 213 of FIG. 5A are interchanged. In other words, the third pair of substrate pads 213 (the second transmission differential pair substrate pads 213a (TX2+) and 213b (TX2−)) and the fourth pair of substrate pads 214 (the first reception differential pair substrate pads 214a (RX1+) and 214b (RX1−)) are sequentially arranged in the first row R1 along the side edge of the chip area 202. The second pair of substrate pads 212 (the second reception differential pair substrate pads 214a (RX2+) and 214b (RX2−)) and the first pair of substrate pads 211 (the first transmission differential pair substrate pads 211a (TX1+) and 211b (TX1−)) are sequentially arranged in the second row R2 along the side edge of the chip area 202. Compared with the second row R2 described above, the first row R1 is farther from a middle area of the package substrate 200, i.e., closer to an outer side of the package substrate 200.

Similar to FIG. 5A, the transmission differential pair substrate pads and reception differential pair substrate pads of the same group are disposed not adjacent to each other and not in the same row, but at approximately diagonal positions. Because projections of the transmission/reception differential pair substrate pads of the same group on the X axis or the Y axis do not overlap with each other and projections of the transmission/reception differential pair substrate pads of different groups on the X axis or the Y axis partially overlap or completely overlap with each other, unnecessary coupling may also be avoided.

Figure 5C:
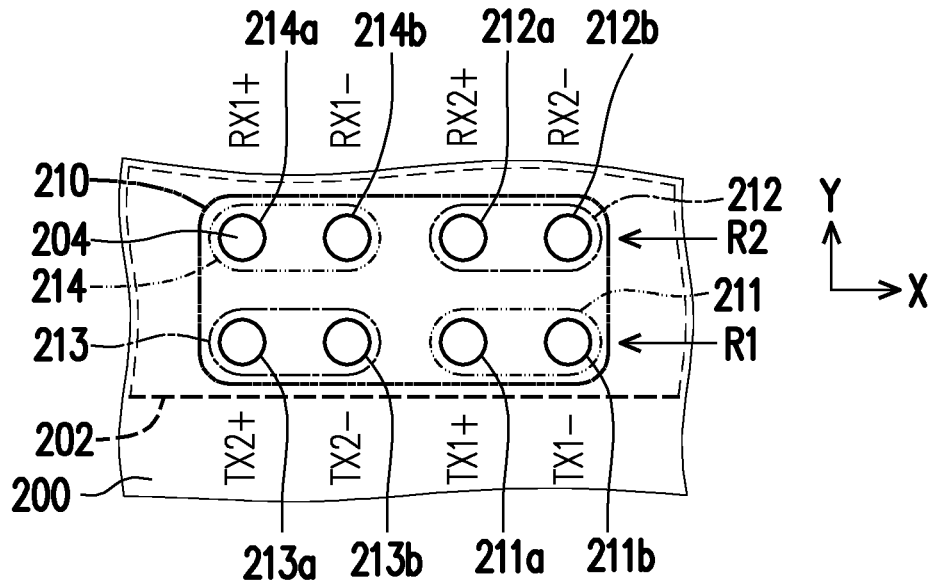
FIG. 5C is a partial top view of a package substrate of another embodiment of the invention.

Referring to FIG. 5C, compared with the embodiment of FIG. 5A, in this embodiment, only the original positions of the second pair of substrate pads 212 and the third pair of substrate pads 213 of FIG. 5A are interchanged. In other words, the third pair of substrate pads 213 (the second transmission differential pair substrate pads 213a (TX2+) and 213b (TX2−)) and the first pair of substrate pads 211 (the first transmission differential pair substrate pads 211a (TX1+) and 211b (TX1−)) are sequentially arranged in the first row R1 along the side edge of the chip area 202. The fourth pair of substrate pads 214 (the first reception differential pair substrate pads 214a (RX1+) and 214b (RX1−)) and the second pair of substrate pads 212 (the second reception differential pair substrate pads 212a (RX2+) and 212b (RX2−)) are sequentially arranged in the second row R2 along the side edge of the chip area 202. Compared with the second row R2 described above, the first row R1 is farther from a middle area of the package substrate 200, i.e., closer to an outer side of the package substrate 200. Similar to FIG. 5A, the transmission differential pair substrate pads and reception differential pair substrate pads of the same group are disposed not adjacent to each other and not in the same row, but at approximately diagonal positions. Because projections of the transmission/reception differential pair substrate pads of the same group on the X axis or the Y axis do not overlap with each other and projections of the transmission/reception differential pair substrate pads of different groups on the X axis or the Y axis partially overlap or completely overlap with each other, unnecessary coupling may also be avoided.

Figure 5D:
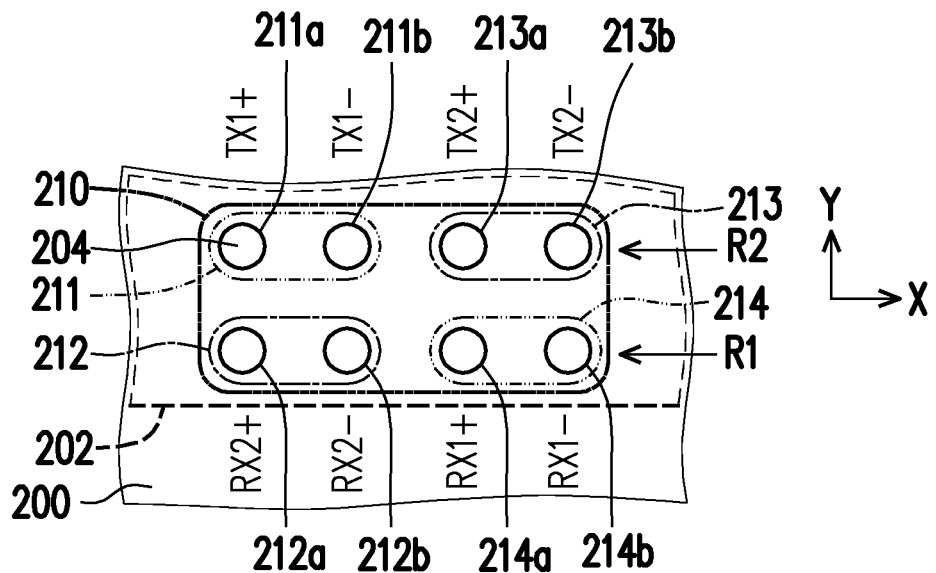
FIG. 5D is a partial top view of a package substrate of another embodiment of the invention.

Referring to FIG. 5D, compared with the embodiment of FIG. 5A, in this embodiment, only the original positions of the first pair of substrate pads 211 and the fourth pair of substrate pads 214 of FIG. 5A are interchanged. In other words, the second pair of substrate pads 212 (the second reception differential pair substrate pads 212a (RX2+) and 212b (RX2−)) and the fourth pair of substrate pads 214 (the first reception differential pair substrate pads 214a (RX1+) and 214b (RX1−)) are sequentially arranged in the first row R1 along the side edge of the chip area 202. The first pair of substrate pads 211 (the first transmission differential pair substrate pads 211a (TX1+) and 211b (TX1−)) and the third pair of substrate pads 213 (the second transmission differential pair substrate pads 213a (TX2+) and 213b (TX2−)) are sequentially arranged in the second row R2 along the side edge of the chip area 202. Compared with the second row R2 described above, the first row R1 is farther from a middle area of the package substrate 200, i.e., closer to an outer side of the package substrate 200. Similar to FIG. 5A, the transmission differential pair substrate pads and reception differential pair substrate pads of the same group are disposed not adjacent to each other and not in the same row, but at approximately diagonal positions. Because projections of the transmission/reception differential pair substrate pads of the same group on the X axis or the Y axis do not overlap with each other and projections of the transmission/ reception differential pair substrate pads of different groups on the X axis or the Y axis partially overlap or completely overlap with each other, unnecessary coupling may also be avoided.

Figure 6A:
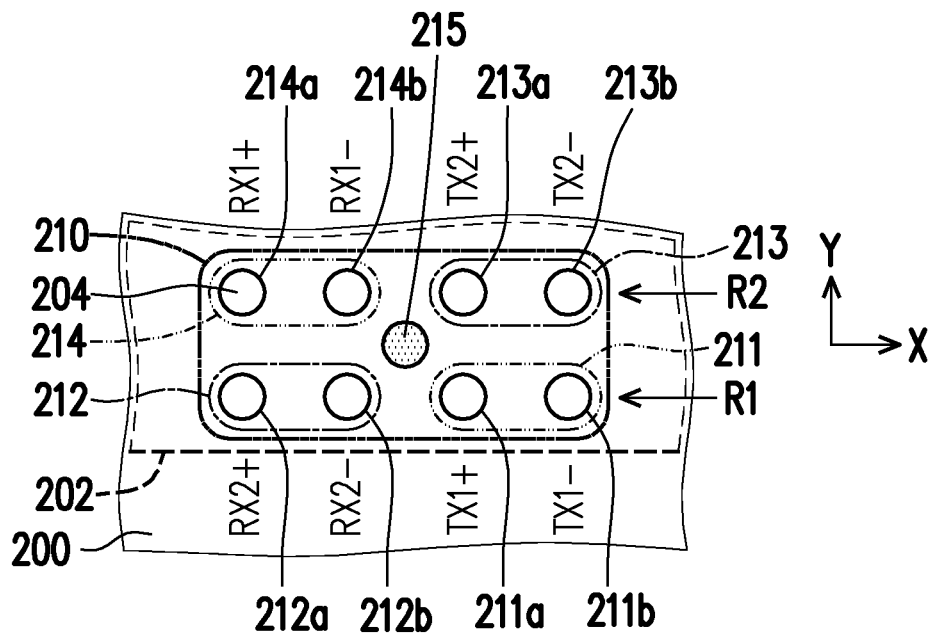
FIG. 6A is a partial top view of a package substrate of another embodiment of the invention.
Figure 6B:
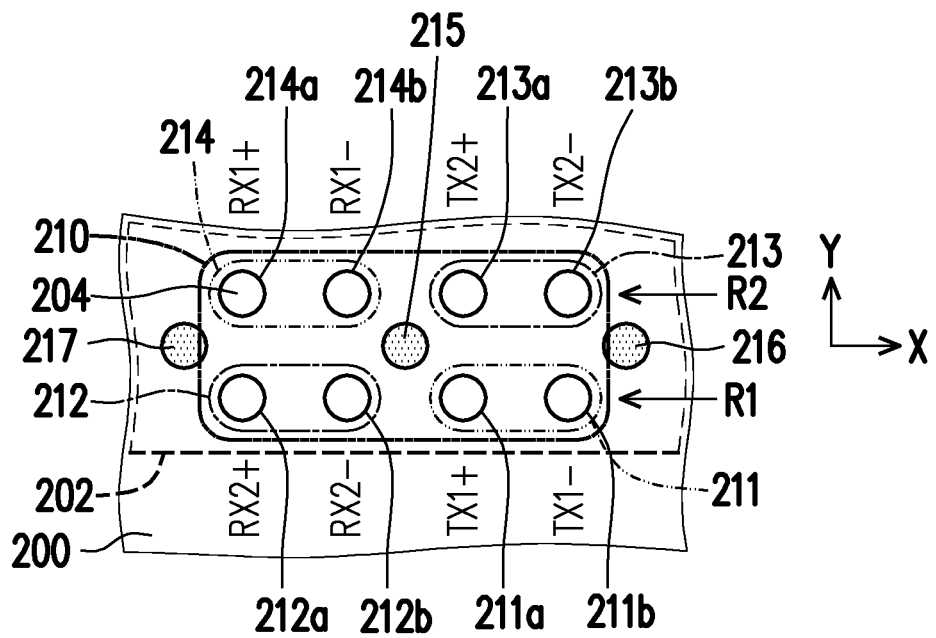
FIG. 6B is a partial top view of a package substrate of another embodiment of the invention.
Figure 6C:
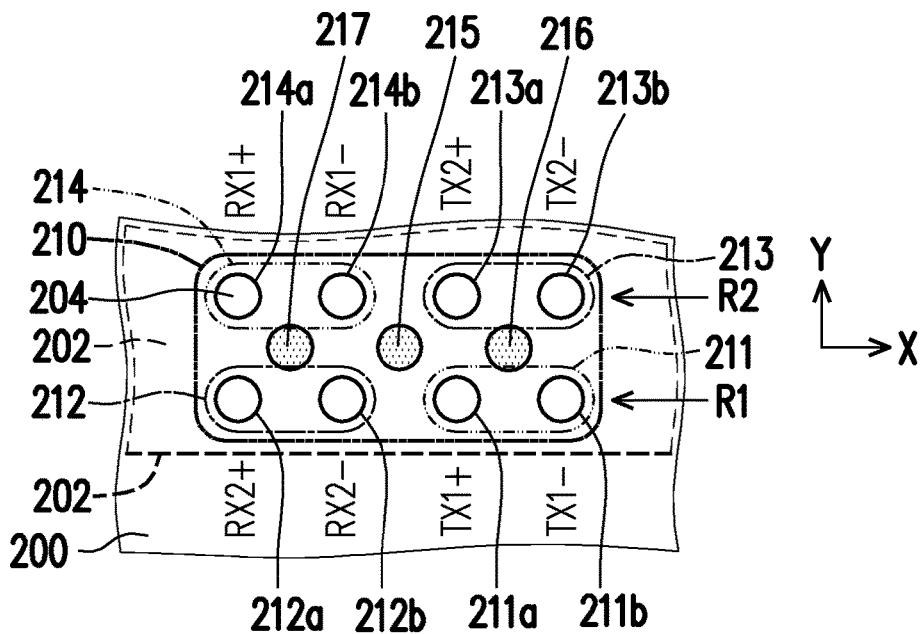
FIG. 6C is a partial top view of a package substrate of another embodiment of the invention.

FIG. 6A to FIG. 6C illustrate embodiments based on the substrate pad arrangement of FIG. 5A with an additional ground (GND/VSS) substrate pad to achieve more isolations between the transmission differential pair substrate pads and the reception differential pair substrate pads of the same group. Similarly, FIG. 6A to FIG. 6C are viewed from the back of the package substrate 200, (a top view from top to bottom), and thus the substrate pads 204 are shown by dashed lines and the substrate pads 204 are arranged on the chip area 202 of the package substrate 200. In certain embodiments, the ground chip pads of FIG. 3A to FIG. 3C may be electrically connected to the corresponding ground substrate pads of FIG. 6 to FIG. 6C through the conductive bumps.

In FIG. 6A, a ground substrate pad is inserted in the middle of the substrate pad arrangement. In other words, the first substrate pad arrangement 210 includes a first ground substrate pad 215, which is located between the first pair of substrate pads 211, the second pair of substrate pads 212, the third pair of substrate pads 213 and the fourth pair of substrate pads 214. In detail, when electrically connected, the ground substrate pad 215 isolates the first transmission differential pair substrate pads 211a and 211b (TX1+ and TX1−) and the first reception differential pair substrate pads 214a and 214b (RX1+ and RX1−). In other words, the ground substrate pad 215 is disposed between the first transmission differential pair substrate pad 211a and the first reception differential pair substrate pad 214b. Here, for the transmission/reception differential pair substrate pads of the same group (the first pair of substrate pads 211 and the fourth pair of substrate pads 214), the shortest distance is between the first transmission differential pair substrate pad 211a and the first reception differential pair substrate pad 214b. Similarly, in another embodiment, when electrically connected, the ground substrate pad 215 isolates the second transmission differential pair substrate pads 213a and 213b (TX2+ and TX2−) and the second reception differential pair substrate pads 212a and 212b (RX2+ and RX2−). In other words, the ground substrate pad 215 is disposed between the second transmission differential pair substrate pad 213a and the second reception differential pair substrate pad 212b. Here, for the transmission/reception differential pair substrate pads of the same group (the third pair of substrate pads 213 and the second pair of substrate pads 212), the shortest distance is between the second transmission differential pair substrate pad 213a and the second reception differential pair substrate pad 212b. Compared with FIG. 5A, the configuration of the ground substrate pad 215 may further avoid the problem of signal coupling between the transmission/reception differential pair chip pads of the same group.

Compared with FIG. 6A, a second ground substrate pad 216 and a third ground substrate pad 217 are additionally included in FIG. 6B, i.e., there are three ground substrate pads in this embodiment. In this embodiment, the second ground substrate pad 216 and the third ground substrate pad 217 additionally included are disposed on the right and left sides of the first substrate pad arrangement 210, respectively. In other words, in an X direction from left to right, the pads are the third ground substrate pad 217, the second/fourth pair of substrate pads 212/214, the first ground substrate pad 215, the first/third pair of substrate pads 211/213 and the second ground substrate pad 216 in that sequence. In a Y direction from bottom to top, the pads are the first/second pair of substrate pads 211/212, the first/second/third ground substrate pads 215/216/217 and the third/fourth pair of substrate pads 213/214 in that sequence. In other words, the second ground substrate pad 216 is located on one side of the first pair of substrate pads 211 and the third pair of substrate pads 213 farther from the first ground substrate pad 215. The third ground substrate pad 217 is located on one side of the second pair of substrate pads 212 and the fourth pair of substrate pads 214 farther from the first ground substrate pad 215. Such configuration of the substrate pads may also further avoid the problem of signal coupling between the transmission/reception differential pair chip pads of the same group.

Compared with FIG. 6A, a second ground substrate pad 216 and a third ground substrate pad 217 are additionally included in FIG. 6C, i.e., there are three ground substrate pads in this embodiment. In this embodiment, the second ground substrate pad 216 and the third ground substrate pad 217 additionally included are disposed between the first pair of substrate pads 211 and the third pair of substrate pads 213 and between the second pair of substrate pads 212 and the fourth pair of substrate pads 214, respectively. In other words, in an X direction from left to right, the pads are the second reception differential pair substrate pad 212a (RX2+)/the first reception differential pair substrate pad 214a (RX1+), the third ground substrate pad 217, the second reception differential pair substrate pad 212b (RX2−)/the first reception differential pair substrate pad 214b (RX1−), the first ground substrate pad 215, the first transmission differential pair substrate pad 211a (TX1+)/the second transmission differential pair substrate pad 213a (TX2+), the second ground substrate pad 216 and the first transmission differential pair substrate pad 211b (TX1−)/the second transmission differential pair substrate pad 213b (TX2−) in that sequence. In a Y direction from bottom to top, the pads are the first/second pair of substrate pads 211/212, the first/second/third ground substrate pads 215/216/217 and the third/fourth pair of substrate pads 213/214 in that sequence. In other words, the second ground substrate pad 216 is located between the first pair of substrate pads 211 and the third pair of substrate pads 213. The third ground substrate pad 217 is located between the second pair of substrate pads 212 and the fourth pair of substrate pads 214. Such configuration of the substrate pads may also further avoid the problem of signal coupling between the transmission/reception differential pair chip pads of the same group.

Figure 7:
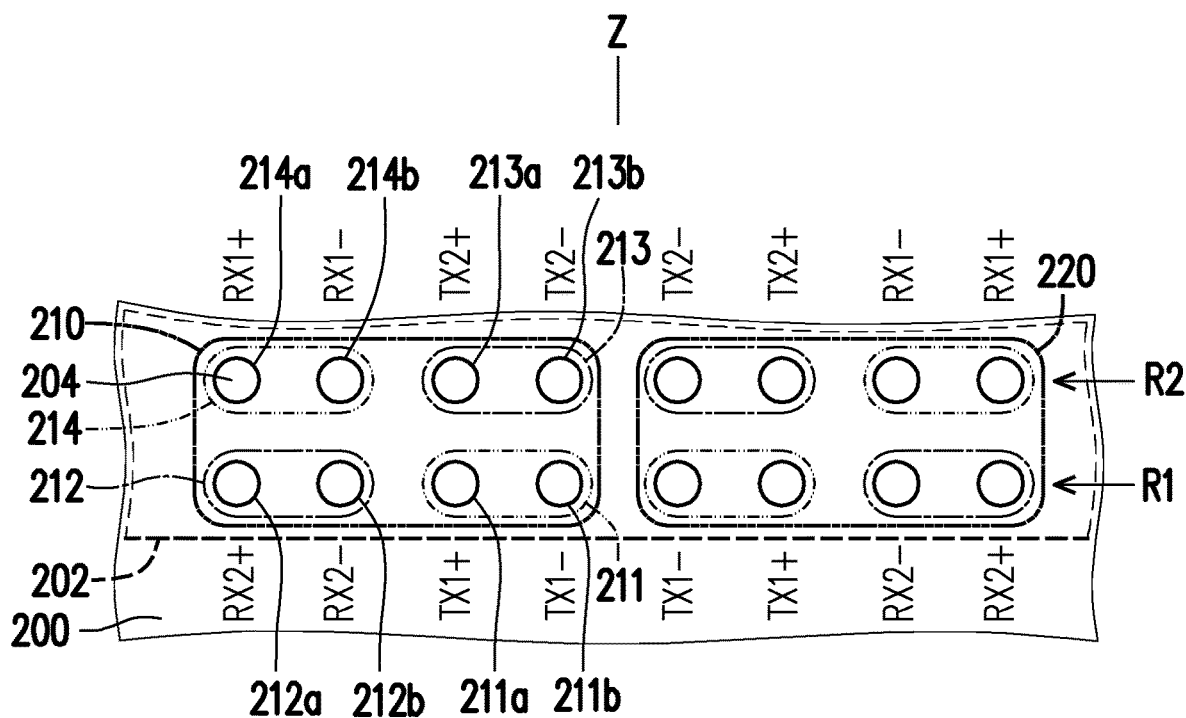
FIG. 7 is a partial top view of a package substrate of another embodiment of the invention.

FIG. 7 shows another embodiment by a top view from top to bottom as viewed from the back of the chip. The package substrate 200 further includes a second substrate pad arrangement 220. The second substrate pad arrangement 220 is located on the chip area 202 and arranged side by side with the first substrate pad arrangement 210 along the side edge of the chip area 202. A layout of the substrate pads 204 of the second substrate pad arrangement 220 and a layout of the substrate pads 204 of the first substrate pad arrangement 210 are symmetrical to each other. In other words, based on a symmetry line Z, the first substrate pad arrangement 210 and the second substrate pad arrangement 220 are in a mirror relationship. In this embodiment, two Type-C ports are taken as an example, but not intended to limit the application of the invention. In addition, the first substrate pad arrangement 210 and the second substrate pad arrangement 220 respectively support one single Type-C port and are compatible with specifications of USB 4 or below. It means the first substrate pad arrangement 210 and the second substrate pad arrangement 220 support different Type-C port.

In the foregoing embodiments, the first transmission differential pair substrate pads 211a and 211b (TX1+ and TX1−), the first reception differential pair substrate pads 214a and 214b (RX1+ and RX1−), the second transmission differential pair substrate pads 213a and 213b (TX2+ and TX2−) and the second reception differential pair substrate pads 212a and 212b (RX2+ and RX2−) may be used as down ports of the UBS hub.

FIG. 7 shows another embodiment, in which the package substrate 200 further includes a second substrate pad arrangement 220. The second substrate pad arrangement 220 is located on the chip area 202 and arranged side by side with the first substrate pad arrangement 210 along the side edge of the chip area 202. A layout of the substrate pads 204 of the second substrate pad arrangement 220 and a layout of the substrate pads 204 of the first substrate pad arrangement 210 are symmetrical to each other. In other words, based on a symmetry line Z, the first substrate pad arrangement 210 and the second substrate pad arrangement 220 are in a mirror relationship. In this embodiment, two Type-C ports are taken as an example, but not intended to limit the application of the invention. In addition, the first substrate pad arrangement 210 and the second substrate pad arrangement 220 respectively support one single Type-C port and are compatible with specifications of USB 4 or below.

Figure 8:
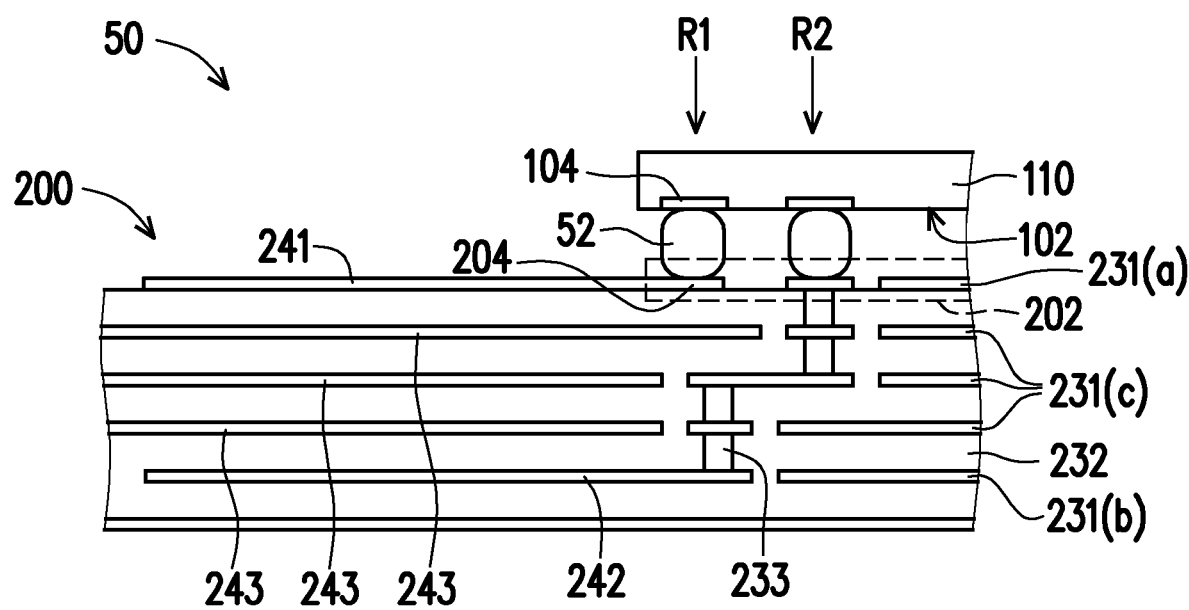
FIG. 8 is a partial enlarged cross-sectional view of the electronic assembly of FIG. 1.

Referring to FIG. 5A and FIG. 8, in this embodiment, the package substrate 200 may include a plurality of patterned conductive layers 231, a plurality of dielectric layers 232 and a plurality of conductive vias 233. These patterned conductive layers 231 include a first patterned conductive layer 231a, a second patterned conductive layer 231b and a third patterned conductive layer 231c. Here, the first substrate pad arrangement 210 is formed from the first patterned conductive layer 231a. These dielectric layers 232 are alternately stacked with the patterned conductive layers 231a to 231c. These conductive vias 233 pass through the dielectric layers 232 to connect the patterned conductive layers 231a to 231c.

In addition, the package substrate 200 may further include a first differential pair trace 241, a second differential pair trace 242 and one or more ground planes 243. The first differential pair trace 241 is formed from the first patterned conductive layer 231a and connects the first pair of substrate pads 211 or/and the second pair of substrate pads 212 of the first row R1 closer to the side edge of the chip area 202, respectively. The second differential pair trace 242 is formed from the second patterned conductive layer 231b and electrically connects the third pair of substrate pads 213 or/and the fourth pair of substrate pads 214 of the second row R2 farther from the side edge of the chip area 202 through the patterned conductive layers 231c and the conductive vias 233, respectively. The one or more ground planes 243 are formed from the third patterned conductive layer 231c and located between the first differential pair trace 241 and the second differential pair trace 242. Therefore, the differential pair substrate pads 204 of the same group (e.g., the first transmission differential pair substrate pads 211a and 211b in the first row R1 and the first reception differential pair substrate pads 214a and 214b in the second row R2) may be routed on the two different patterned conductive layers 231a and 231b of the package substrate 200 through the conductive vias 233. Also, the ground plane 243 is further located between the first differential pair trace 241 and the second differential pair trace 242, thereby reducing crosstalk between the transmission and reception (TX and RX) differential pairs of the same group. In addition, the ground substrate pads 215 to 217 in the embodiments of FIG. 6A to FIG. 6C may also be electrically connected to the ground planes 243.

In summary, in the embodiments of the invention, for the integrated circuit chip, by arranging two groups of transmission and reception (TX and RX) differential pair chip pads in two rows along the side edge of the active surface, and placing the transmission and reception differential pair chip pads of the same group in different rows, crosstalk between the transmission and reception differential pair chip pads of the same group may be reduced. Moreover, by arranging two groups of transmission and reception (TX and RX) differential pair chip pads in two rows, a size of the integrated circuit chip may be reduced to lower the costs.

For the package substrate, by arranging two groups of transmission and reception (TX and RX) differential pair substrate pads in two rows along the side edge of the chip area, and placing the transmission and reception differential pair substrate pads of the same group in different rows, crosstalk between the transmission and reception differential pair substrate pads of the same group may be reduced.

The invention claimed is:

1. An integrated circuit chip for at least supporting USB port, having an active surface and a first chip pad arrangement located on the active surface, the first chip pad arrangement comprising:
   a first pair of chip pads;
   a second pair of chip pads;
   a third pair of chip pads; and
   a fourth pair of chip pads, wherein
   each of the first pair of chip pads, the second pair of chip pads, the third pair of chip pads and the fourth pair of chip pads comprises two differential pair chip pads,
   the two differential pair chip pads of the first pair of chip pads and the two differential pair chip pads of the second pair of chip pads are arranged pad by pad in a first row along a side edge of the active surface,
   the two differential pair chip pads of the third pair of chip pads and the two differential pair chip pads of the fourth pair of chip pads are arranged pad by pad in a second row along the side edge of the active surface,
   the first pair of chip pads is located between the side edge of the active surface and the third pair of chip pads,
   the second pair of chip pads is located between the side edge of the active surface and the fourth pair of chip pads,
   the first pair of chip pads is one pair of a pair of first transmission differential pair chip pads and a pair of first reception differential pair chip pads, and the fourth pair of chip pads is the other one pair of the pair of the first transmission differential pair chip pads and the pair of the first reception differential pair chip pads,
   the second pair of chip pads is one pair of a pair of second transmission differential pair chip pads and a pair of second reception differential pair chip pads, and the third pair of chip pads is the other one pair of the pair of the second transmission differential pair chip pads and the pair of the second reception differential pair chip pads;
   for flip-able requirement, when a first transmission differential pair signal of the pair of the first transmission differential pair chip pads and a first reception differential pair signal of the pair of the first reception differential pair chip pads are transmitted, a second transmission differential pair signal of the pair of the second transmission differential pair chip pads and a second reception differential pair signal of the pair of the second reception differential pair chip pads are not transmitted or maintain an original state;

a projection of a diagonal line connecting one of the pair of the first transmission differential pair chip pads and one of the pair of the first reception differential pair chip pads on the active surface intersects a projection of a diagonal line connecting one of the pair of the second transmission differential pair chip pads and one of the pair of the second reception differential pair chip pads on the active surface;

wherein the first transmission differential pair chip pads and the first reception differential pair chip pads are disposed on position not adjacent to each other and in different rows, and the first transmission differential pair chip pads and the second reception differential pair chip pads are adjacent to each other in the first row, the first transmission differential pair chip pads in the first row and the second transmission differential pair chip pads in the second row are adjacent to each other.

2. The integrated circuit chip according to claim 1, wherein projections of the first pair of chip pads and the fourth pair of chip pads on a straight line parallel to the first row or on another straight line perpendicular to the first row do not overlap with each other.

3. The integrated circuit chip according to claim 1, wherein projections of the third pair of chip pads and the second pair of chip pads on a straight line parallel to the first row or on another straight line perpendicular to the first row do not overlap with each other.

4. The integrated circuit chip according to claim 1, wherein projections of the first pair of chip pads and the third pair of chip pads on a straight line parallel to the first row overlap with each other, and projections of the fourth pair of chip pads and the second pair of chip pads on the straight line partially overlap or completely overlap with each other.

5. The integrated circuit chip according to claim 1, wherein projections of the first pair of chip pads and the second pair of chip pads on a straight line perpendicular to the first row overlap with each other, and projections of the third pair of chip pads and the fourth pair of chip pads on the straight line partially overlap or completely overlap with each other.

6. The integrated circuit chip according to claim 1, wherein the first chip pad arrangement further comprises:
a ground chip pad, located between the first pair of chip pads, the second pair of chip pads, the third pair of chip pads and the fourth pair of chip pads.

7. The integrated circuit chip according to claim 1, wherein the first chip pad arrangement further comprises:
a first ground chip pad, located between the first pair of chip pads, the second pair of chip pads, the third pair of chip pads and the fourth pair of chip pads;
a second ground chip pad, located on one side of the first pair of chip pads and the third pair of chip pads farther from the first ground chip pad; and
a third ground chip pad, located on one side of the second pair of chip pads and the fourth pair of chip pads farther from the first ground chip pad.

8. The integrated circuit chip according to claim 1, wherein the first chip pad arrangement further comprises:
a first ground chip pad, located between the first pair of chip pads, the second pair of chip pads, the third pair of chip pads and the fourth pair of chip pads;
a second ground chip pad, located between the first pair of chip pads and the third pair of chip pads; and
a third ground chip pad, located between the second pair of chip pads and the fourth pair of chip pads.

9. The integrated circuit chip according to claim 1, further comprising:

a second chip pad arrangement, located on the active surface and arranged side by side with the first chip pad arrangement along the side edge of the active surface, wherein a layout of chip pads of the second chip pad arrangement and a layout of chip pads of the first chip pad arrangement are structurally symmetrical to each other.

10. The integrated circuit chip according to claim 9, wherein the layout of chip pads of the second chip pad arrangement and the layout of chip pads of the first chip pad arrangement are functionally in a mirror relationship.

11. The integrated circuit chip according to claim 9, wherein no other pad exists between the first pair of chip pads of the first chip pad arrangement and a first pair of chip pads of the second chip pad arrangement in the first row, and no other pad exists between the third pair of chip pads of the first chip pad arrangement and a third pair of chip pads of the second chip pad arrangement in the second row.

12. A package substrate for at least supporting USB port, adapted for an integrated circuit chip in a flip-chip bonding manner and having a chip area and a first substrate pad arrangement located on the chip area, the first substrate pad arrangement comprising:
a first pair of substrate pads;
a second pair of substrate pads;
a third pair of substrate pads; and
a fourth pair of substrate pads, wherein
each of the first pair of substrate pads, the second pair of substrate pads, the third pair of substrate pads and the fourth pair of substrate pads comprises two differential pair substrate pads,
the two differential pair substrate pads of the first pair of substrate pads and the two differential pair substrate pads of the second pair of substrate pads are arranged pad by pad in a first row along a side edge of the chip area,
the two differential pair substrate pads of the third pair of substrate pads and the two differential pair substrate pads of the fourth pair of substrate pads are arranged pad by pad in a second row along the side edge of the chip area,
the first pair of substrate pads is located between the side edge of the chip area and the third pair of substrate pads,
the second pair of substrate pads is located between the side edge of the chip area and the fourth pair of substrate pads,
the first pair of substrate pads is one pair of a pair of first transmission differential pair substrate pads and a pair of first reception differential pair substrate pads, and the fourth pair of substrate pads is the other one pair of the pair of the first transmission differential pair substrate pads and the pair of the first reception differential pair substrate pads,
the second pair of substrate pads is one pair of a pair of second transmission differential pair substrate pads and a pair of second reception differential pair substrate pads, and the third pair of substrate pads is the other one pair of the pair of the second transmission differential pair substrate pads and the pair of the second reception differential pair substrate pads;
for flip-able requirement, when a first transmission differential pair signal of the pair of the first transmission differential pair substrate pads and a first reception differential pair signal of the pair of the first reception differential pair substrate pads are transmitted, a second transmission differential pair signal of the pair of the second transmission differential pair substrate pads and a second reception differential pair signal of the pair of the second reception differential pair substrate pads are not transmitted or maintain an original state;

a projection of a diagonal line connecting one of the pair of the first transmission differential pair substrate pads and one of the pair of the first reception differential pair substrate pads on the chip area intersects a projection of a diagonal line connecting one of the pair of the second transmission differential pair substrate pads and one of the pair of the second reception differential pair substrate pads on the chip area;

wherein the first transmission differential pair substrate pads and the first reception differential pair substrate pads are disposed on position not adjacent to each other and in different rows, and the first transmission differential pair substrate pads and the second reception differential pair substrate pads are adjacent to each other in the first row, the first transmission differential pair substrate pads in the first row and the second transmission differential pair substrate pads in the second row are adjacent to each other.

13. The package substrate according to claim 12, wherein projections of the first pair of substrate pads and the fourth pair of substrate pads on a straight line parallel to the first row or on another straight line perpendicular to the first row do not overlap with each other.

14. The package substrate according to claim 12, wherein projections of the third pair of substrate pads and the second pair of substrate pads on a straight line parallel to the first row or on another straight line perpendicular to the first row do not overlap with each other.

15. The package substrate according to claim 12, wherein projections of the first pair of substrate pads and the third pair of substrate pads on a straight line parallel to the first row overlap with each other, and projections of the fourth pair of substrate pads and the second pair of substrate pads on the straight line partially overlap or completely overlap with each other.

16. The package substrate according to claim 12, wherein projections of the first pair of substrate pads and the second pair of substrate pads on a straight line perpendicular to the first row overlap with each other, and projections of the third pair of substrate pads and the fourth pair of substrate pads on the straight line partially overlap or completely overlap with each other.

17. The package substrate according to claim 12, wherein the first substrate pad arrangement further comprises:
a ground substrate pad, located between the first pair of substrate pads, the second pair of substrate pads, the third pair of substrate pads and the fourth pair of substrate pads.

18. The package substrate according to claim 12, wherein the first substrate pad arrangement further comprises:
a first ground substrate pad, located between the first pair of substrate pads, the second pair of substrate pads, the third pair of substrate pads and the fourth pair of substrate pads;
a second ground substrate pad, located on one side of the first pair of substrate pads and the third pair of substrate pads farther from the first ground substrate pad; and
a third ground substrate pad, located on one side of the second pair of substrate pads and the fourth pair of substrate pads farther from the first ground substrate pad.

19. The package substrate according to claim 12, wherein the first substrate pad arrangement further comprises:
a first ground substrate pad, located between the first pair of substrate pads, the second pair of substrate pads, the third pair of substrate pads and the fourth pair of substrate pads;
a second ground substrate pad, located between the first pair of substrate pads and the third pair of substrate pads; and
a third ground substrate pad, located between the second pair of substrate pads and the fourth pair of substrate pads.

20. The package substrate according to claim 12, further comprising:
a second substrate pad arrangement, located on the chip area and arranged side by side with the first substrate pad arrangement along the side edge of the chip area, wherein a layout of substrate pads of the second substrate pad arrangement and a layout of substrate pads of the first substrate pad arrangement are structurally symmetrical to each other.

21. The package substrate according to claim 20, wherein the layout of substrate pads of the second substrate pad arrangement and the layout of substrate pads of the first substrate pad arrangement are functionally in a mirror relationship.

22. The package substrate according to claim 20, wherein no other pad exists between the first pair of substrate pads of the first substrate pad arrangement and a first pair of substrate pads of the second substrate pad arrangement in the first row, and no other pad exists between the third pair of substrate pads of the first substrate pad arrangement and a third pair of substrate pads of the second substrate pad arrangement in the second row.

23. The package substrate according to claim 12, further comprising:
a plurality of patterned conductive layers, comprising a first patterned conductive layer, a second patterned conductive layer and a third patterned conductive layer, wherein the first substrate pad arrangement is formed from the first patterned conductive layer;
a plurality of dielectric layers, alternately stacked with the patterned conductive layers;
a plurality of conductive vias, passing through the dielectric layers to connect the patterned conductive layers;
a first differential pair trace, formed from the first patterned conductive layer and connecting the first pair of substrate pads or/and the second pair of substrate pads, respectively; and
a second differential pair trace, formed from the second patterned conductive layer and electrically connecting the third pair of substrate pads or/and the fourth pair of substrate pads through the patterned conductive layers and the conductive vias, respectively.

24. The package substrate according to claim 23, further comprising:
a ground plane, formed from the third patterned conductive layer and located between the first differential pair trace and the second differential pair trace.

25. The package substrate according to claim 24, wherein the first substrate pad arrangement further comprises:
a ground substrate pad, located between the first pair of substrate pads, the second pair of substrate pads, the third pair of substrate pads and the fourth pair of substrate pads, the ground substrate pad being electrically connected to the ground plane.

26. An electronic assembly, comprising:
a package substrate for at least supporting USB port, having a chip area and a first substrate pad arrangement located on the chip area, the first substrate pad arrangement comprising:
   a first pair of substrate pads;
   a second pair of substrate pads;
   a third pair of substrate pads; and
   a fourth pair of substrate pads, wherein
   each of the first pair of substrate pads, the second pair of substrate pads, the third pair of substrate pads and the fourth pair of substrate pads comprises two differential pair substrate pads,
   the two differential pair substrate pads of the first pair of substrate pads and the two differential pair substrate pads of the second pair of substrate pads are arranged pad by pad in a first row along a side edge of the chip area,
   the two differential pair substrate pads of the third pair of substrate pads and the two differential pair substrate pads of the fourth pair of substrate pads are arranged pad by pad in a second row along the side edge of the chip area,
   the first pair of substrate pads is located between the side edge of the chip area and the third pair of substrate pads,
   the second pair of substrate pads is located between the side edge of the chip area and the fourth pair of substrate pads,
   the first pair of substrate pads is one pair of a pair of first transmission differential pair substrate pads and a pair of first reception differential pair substrate pads, and the fourth pair of substrate pads is the other one pair of the pair of the first transmission differential pair substrate pads and the pair of the first reception differential pair substrate pads,
   the second pair of substrate pads is one pair of a pair of second transmission differential pair substrate pads and a pair of second reception differential pair substrate pads, and the third pair of substrate pads is the other one pair of the pair of the second transmission differential pair substrate pads and the pair of the second reception differential pair substrate pads; and
an integrated circuit chip, installed on the chip area of the package substrate in a flip-chip bonding manner;
for flip-able requirement, when a first transmission differential pair signal of the pair of the first transmission differential pair substrate pads and a first reception differential pair signal of the pair of the first reception differential pair substrate pads are transmitted, a second transmission differential pair signal of the pair of the second transmission differential pair substrate pads and a second reception differential pair signal of the pair of the second reception differential pair substrate pads are not transmitted or maintain an original state;
a projection of a diagonal line connecting one of the pair of the first transmission differential pair substrate pads and one of the pair of the first reception differential pair substrate pads on the chip area intersects a projection of a diagonal line connecting one of the pair of the second transmission differential pair substrate pads and one of the pair of the second reception differential pair substrate pads on the chip area;
wherein the first transmission differential pair substrate pads and the first reception differential pair substrate pads are disposed on position not adjacent to each other and in different rows, and the first transmission differential pair substrate pads and the second reception differential pair substrate pads are adjacent to each other in the first row, the first transmission differential pair substrate pads in the first row and the second transmission differential pair substrate pads in the second row are adjacent to each other.

27. The electronic assembly according to claim 26, wherein the integrated circuit chip has an active surface and a first chip pad arrangement located on the active surface, and the first chip pad arrangement comprises:
   a first pair of chip pads;
   a second pair of chip pads;
   a third pair of chip pads; and
   a fourth pair of chip pads, wherein
   the first pair of chip pads and the second pair of chip pads are sequentially arranged in a first row along a side edge of the active surface,
   the third pair of chip pads and the fourth pair of chip pads are sequentially arranged in a second row along the side edge of the active surface,
   the first pair of chip pads is located between the side edge of the active surface and the third pair of chip pads,
   the second pair of chip pads is located between the side edge of the active surface and the fourth pair of chip pads,
   wherein the first pair of chip pads and the first pair of substrate pads are electrically connected, the second pair of chip pads and the second pair of substrate pads are electrically connected, the third pair of chip pads and the third pair of substrate pads are electrically connected, and the fourth pair of chip pads and the fourth pair of substrate pads are electrically connected.

28. The electronic assembly according to claim 27, wherein the first substrate pad arrangement further comprises:
   a ground substrate pad, located between the first pair of substrate pads, the second pair of substrate pads, the third pair of substrate pads and the fourth pair of substrate pads,
   the first chip pad arrangement further comprises:
   a ground chip pad, located between the first pair of chip pads, the second pair of chip pads, the third pair of chip pads and the fourth pair of chip pads,
   wherein the ground chip pad and the ground substrate pad are electrically connected.

* * * * *